(12) United States Patent
Pluymers (10) Patent No.: US 7,717,470 B1
(45) Date of Patent: May 18, 2010

(54) QUICK FLUID CONNECTOR LEAKAGE CONTAINMENT

(75) Inventor: Brian A. Pluymers, Haddonfield, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 885 days.

(21) Appl. No.: 10/640,445

(22) Filed: Aug. 13, 2003

(51) Int. Cl.
*F16L 55/00* (2006.01)
(52) U.S. Cl. .......................................... 285/14; 285/13
(58) Field of Classification Search ................... 285/13, 285/14, 370, 397, 123.1, 123, 123.12, 12, 285/272.1
See application file for complete search history.

(56) References Cited

U.S. PATENT DOCUMENTS

| | | | | |
|---|---|---|---|---|
| 1,664,125 A | * | 3/1928 | Lowrey | ........................ 285/13 |
| 3,780,802 A | * | 12/1973 | Phipps et al. | ............. 285/123.3 |
| 4,669,760 A | * | 6/1987 | Hashish et al. | ............... 285/370 |
| 5,094,480 A | * | 3/1992 | Boileau | ........................ 285/14 |
| 6,431,608 B1 | * | 8/2002 | Kato | ............................. 285/13 |

FOREIGN PATENT DOCUMENTS

| | | | | | |
|---|---|---|---|---|---|
| DE | 531752 | | * | 8/1931 | ................... 285/13 |
| GB | 2107809 | A | * | 5/1983 | ................... 285/13 |

* cited by examiner

*Primary Examiner*—Aaron M Dunwoody
(74) *Attorney, Agent, or Firm*—Duane Morris LLP

(57) ABSTRACT

A quick fluid connector includes two mating portions. Leakage may occur during mating and demating. In order to contain such leakage, the mating portions of the connector are mounted on the distal end of a projecting boss and at the fundus of a matching well, respectively, so that the boss and well together define a chamber which surrounds the two mating portions of the quick connector. One or more drainage channels are coupled to the chamber to carry away leakage.

10 Claims, 6 Drawing Sheets

QUICK FLUID CONNECTOR LEAKAGE CONTAINMENT

GOVERNMENTAL INTEREST

This invention was prepared under government contract N00024-99-9-5386 (NTW Radar Prototype). The United States Government has a non-exclusive, non-transferable, paid-up license in this invention.

FIELD OF THE INVENTION

This invention relates to cooling systems, and more particularly to fluid, particularly liquid, cooling systems for electronic equipment, which equipment includes plural replaceable units.

BACKGROUND OF THE INVENTION

Active antenna arrays have the potential to improve and expand the capability and reliability of commercial and military ground, shipboard, airborne, missile, and space-based radar and communications systems. The primary components and cost drivers of such active array antennas tend to be microwave multi-chip modules incorporating monolithic microwave integrated circuits (MMICs) and the power supplies which must be associated with the modules. Such modules are often know as transmit-receive (TR) modules. These primary components or modules are often packaged in assemblies known as line replaceable units (LRUs), which typically incorporate a common mounting plate, control and power conditioning circuitry, and component-to-component interconnects.

The performance and reliability of the TR module and power supply components are directly dependent upon the temperature at which they operate. More specifically, performance is enhanced and reliability is improved when the component temperatures are minimized. It has been found that provision of convection air cooling may not be practical due to the large heat loads and space constraints, which limit the cross-sectional areas of air movement paths. As a result, a common cooling scheme is to connect the structure of the TR module to a liquid-cooled "cold plate," with component locations and structures designed to reduce the thermal resistance to the cold plate. When the cold plate is itself fluid or liquid cooled, the component locations and structures are designed to reduce the thermal resistance to the coolant.

While the liquid-cooled cold plate provides great advantages insofar as maintaining low component temperatures is concerned, the need for the heat generated by the components to pass through a physical juncture between the LRU and the cold plate still tends to keep the component temperatures higher than may be desired for maximum-performance equipment. The need for maximum performance in conjunction with low operating temperatures has led to the mounting of the heat-generating components directly to the liquid-cooled cold plate, without an intermediary structure. In such an arrangement, the line replaceable unit itself is liquid-cooled. This is a very advantageous system from the point of view of performance and reliability maximization, but may lead to other problems. In particular, the liquid fittings and interconnects which are required to transfer the liquid coolant into and from the LRU imposes limits on the accessibility and therefore maintainability. In particular, when an LRU exhibits degraded performance, it may be desirable to change it out with a properly operating replacement LRU, and the liquid connection fittings and interconnects contribute to the time and effort required to make such a changeover.

The problem associated with the need to disconnect and reconnect liquid coolant paths when working on LRUs or changing over between LRUs has been addressed in the past by the use of liquid quick-connect or quick-disconnect (QD) fittings, which allow rapid connection and/or disconnection of the liquid lines. In the context of densely packed equipment, such as is found, for example, in active antenna arrays, packaging requirements may dictate that the liquid quick-disconnect fittings be of the "blind-mate" type, which in principle do not require that the fittings be visible during the disconnection or connection process.

Improved fluid connection arrangements are desired.

SUMMARY OF THE INVENTION

An arrangement according to an aspect of the invention is for making fluid connection between a fluid source and a fluid sink. The arrangement comprises a first portion of a mating quick fluid connector coupled to the fluid source, and a second portion of the mating quick fluid connector coupled to the fluid sink, whereby leakage between the first and second portions of the quick fluid connector may occur. This leakage may result from failure of the mated quick connection or from inherent limitations of the quick connector during mating and demating. First and second portions of a mating fluid chamber are provided, each of the first and second portions of the mating fluid chamber being associated with one of the first and second portions of the quick fluid connector. The first and second portions of the mating fluid chamber define the chamber when the first and second portions of the quick fluid connector are mated. The chamber, when the first and second portions of the quick fluid connector are mated, surrounds those portions of the quick fluid connector which are subject to leakage. A fluid channel is coupled to the fluid chamber for providing a path for drainage of the leakage entering the chamber.

In a particular embodiment of the arrangement, the first portion of the quick fluid connector is coaxially mounted at the end of a projecting, circularly cylindrical boss defining an exterior first diameter. The second portion of the quick fluid connector is coaxially mounted at the fundus of a cylindrical aperture having an interior second diameter greater than the first diameter. In one version of this embodiment, the arrangement further comprises at least a first O-ring extending, at a first location, about an exterior surface of the projecting circularly cylindrical boss, and a second O-ring extending, at a second location different from the first location, about the exterior surface of the projecting cylindrical boss.

In a most preferred embodiment, the circularly cylindrical boss projects from a surface of a first structure which is orthogonal to the axis of the boss, and the aperture is defined below a surface of a second structure, which surface is orthogonal to the axis of the aperture.

In one manifestation of this version, a first O-ring is located along the length of the projecting boss, and a second O-ring is located at the juncture of the cylindrical boss and the surface from which it projects.

In any embodiment, the first structure may be a line replaceable electronics module and the second structure a cold plate manifold.

DESCRIPTION OF THE INVENTION

Figure 1A:
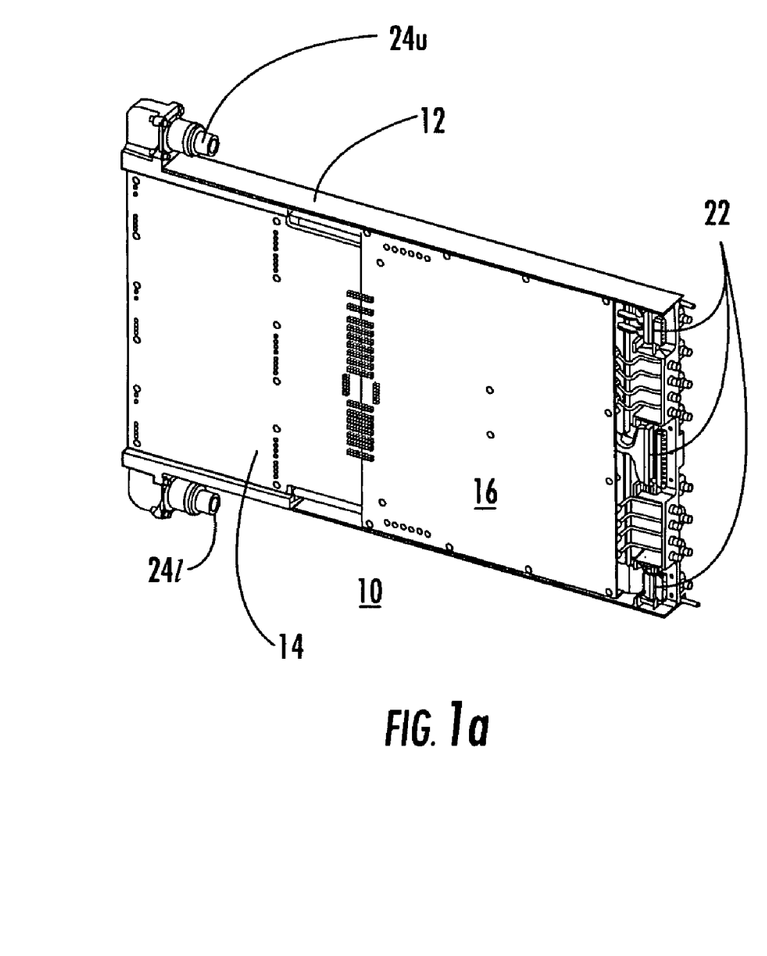
FIG. 1a is a simplified overall view of one side of a generally planar liquid cooled replaceable line unit which makes use of the invention.
Figure 1B:
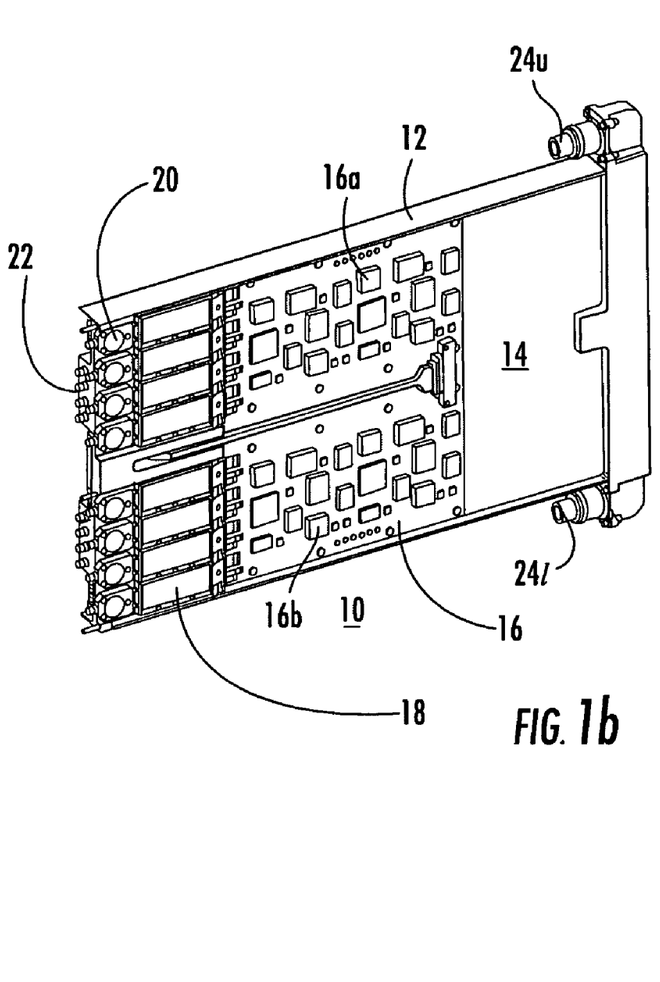
FIG. 1b is a simplified view of the other side of the replaceable line unit.

FIG. 1a is a simplified view of one side of a line replaceable unit (LRU) 10 according to an aspect of the invention, and FIG. 1b illustrates the other side. In FIGS. 1a and 1b, line replaceable unit 10 includes a frame 12, which may also include a coldplate extending through at least a portion of the line replaceable unit in locations not visible in FIG. 1a. The coldplate is provided for thermal transfer from active elements, such as those elements (not illustrated) found in the power supply subassembly 14 region, those elements, such as elements 16a and 16b, located in control printed circuit board (PCB) 16 regions, and those elements, such as transmit-receive (T/R) modules 18, all of which are electrically powered and consequently generate heat. A set of circulators, illustrated as 20, is associated with the T/R modules 18, for coupling signal from the transmitting portion of the T/R modules to radio-frequency (RF) output ports, not separately illustrated portions of power/logic/RF input-output (I/O) ports 22, and for coupling input RF signals to receiving portions of the T/R modules.

When many of the LRUs 10 of FIGS. 1a and 1b are mounted in close proximity, the number of thermal flow paths available for removal of heat from the LRUs is reduced by the presence of other LRUs. Consequently, greater heat must be removed by the remaining paths than would be required if many LRUs were not juxtaposed. Conventionally, fluid cooling is provided, by passing through channels in the cold plate a flow of coolant fluid. Since gases tend to have lower specific heat than liquids, the coolant fluid is most often a liquid, such as water, with or without inhibitors, oil, or the like. In FIGS. 1a and 1b, quick fluid connection arrangements 24u and 24ι provide access of the LRU to a source and sink of coolant fluid or liquid.

Figure 2:
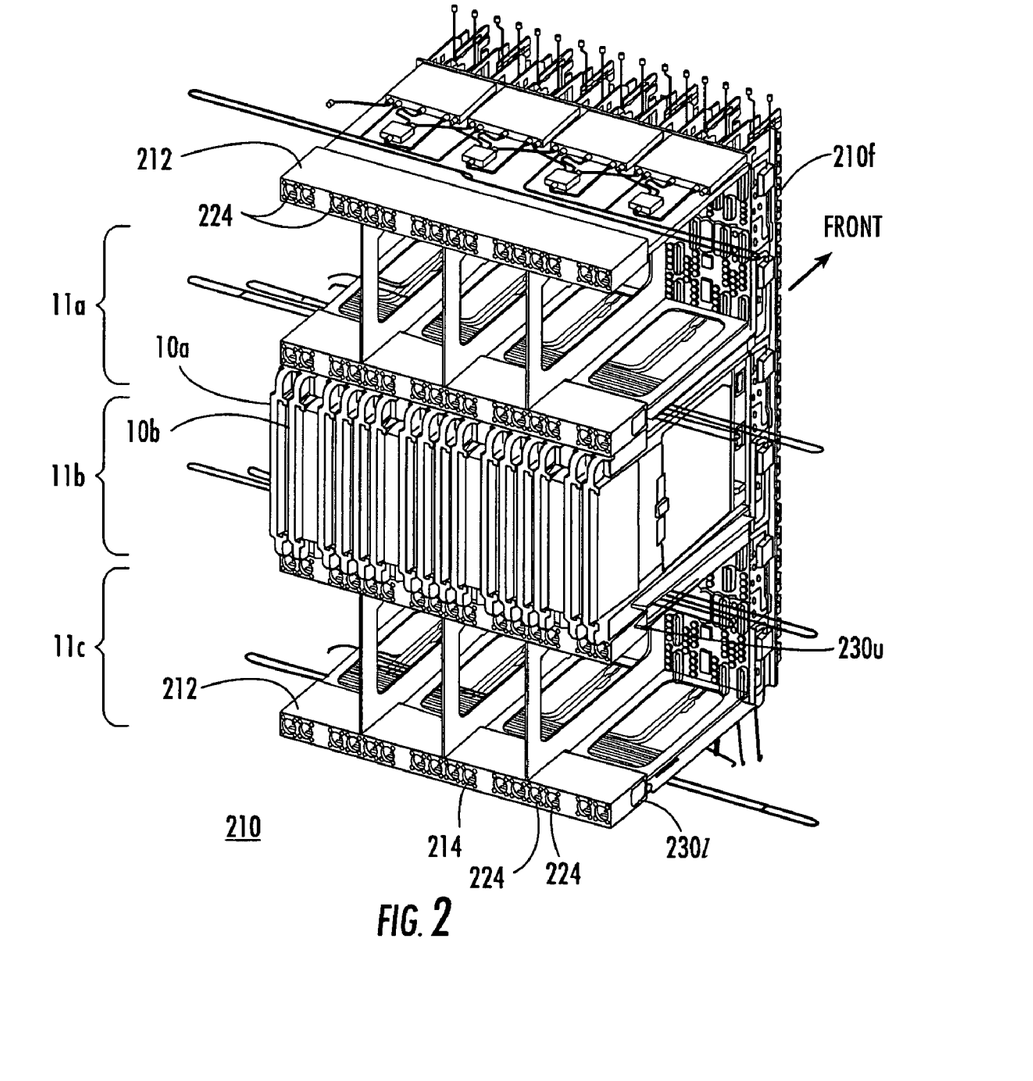
FIG. 2 is an overall view of a portion of a frame for an array which is partially populated with a plurality of liquid cooled replaceable line units corresponding to that illustrated in conjunction with FIGS. 1a and 1b.
Figure 3A:
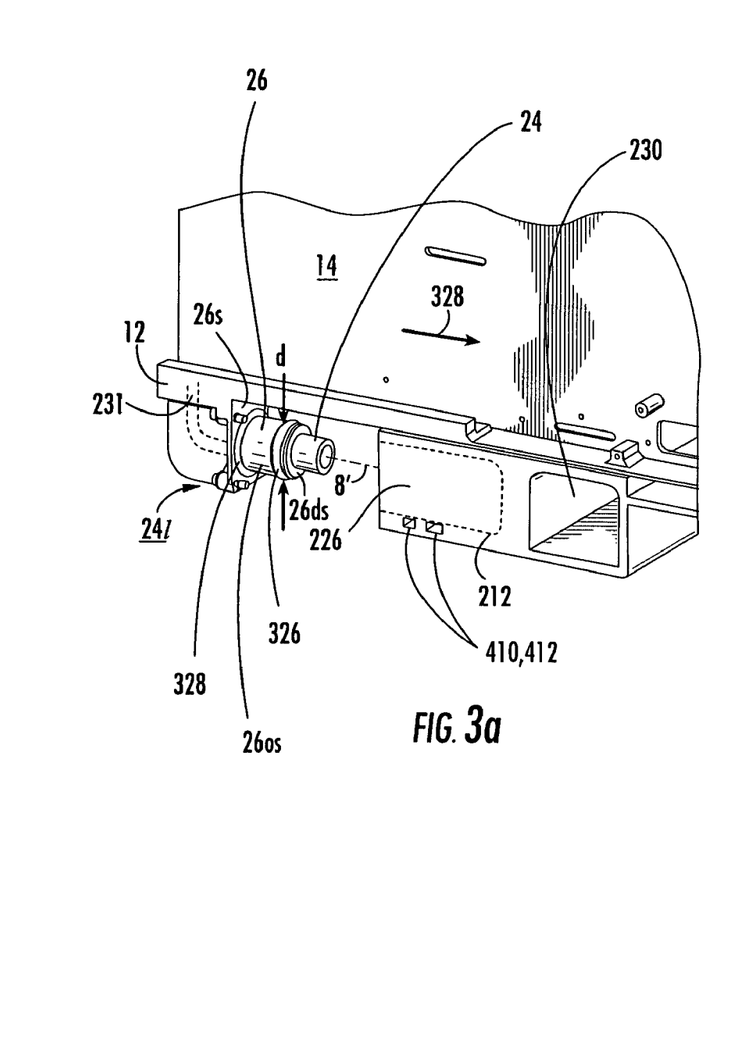
FIGS. 3a and 3b are different simplified perspective or isometric views of a portion of the frame and line replaceable unit of FIG. 2, illustrating, in a non-mated condition, fluid quick connect arrangements according to an aspect of the invention.
Figure 3B:
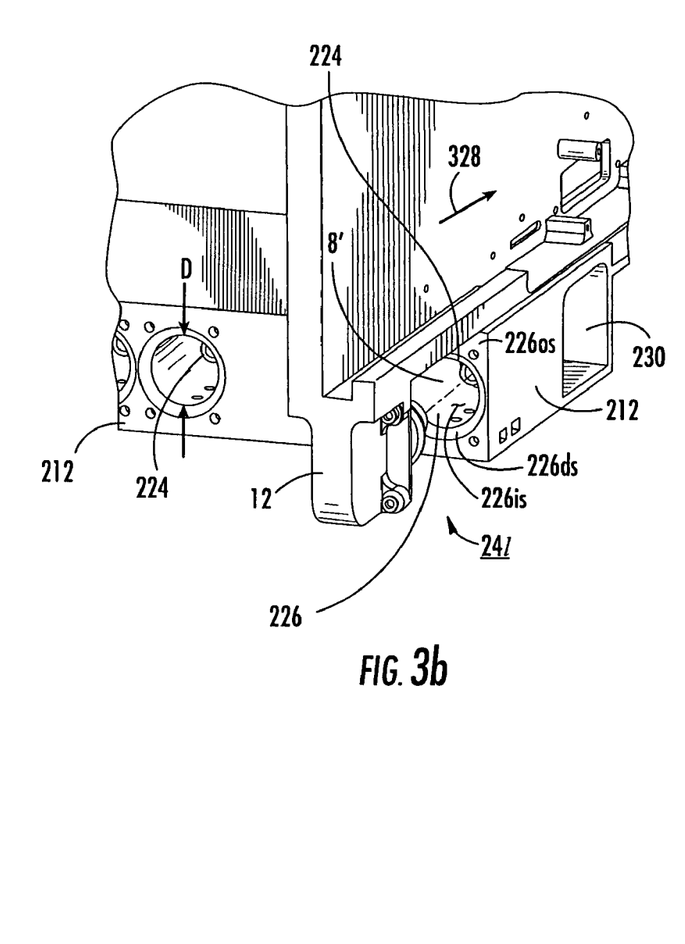

FIGS. 3a and 3b are different simplified perspective or isometric views of mating halves of fluid quick connects and their associated structures. In FIGS. 3a and 3b, the lower portion of an LRU 10 is illustrated, showing its fluid quick connect 24ι according to an aspect of the invention, in spaced relation to the rack body portion 212. The fluid flow path extending through the rack body 212 for providing coolant fluid to, or for removing coolant fluid from, the LRU associated with the quick connect half 224 is illustrated as a coolant manifold supply or return channel 230. Coolant manifold channel 230 communicates with one mating half 224 of a fluid quick connector, illustrated in FIG. 3b as being mounted at the fundus or bottom of a "well," "chamber," or cylindrical opening 226 defined in the structure of the body 212 (of the rack 210 of FIG. 2). The mating half 224 of the fluid quick connector is mounted on the axis of well 226. A corresponding coolant manifold channel, illustrated in phantom as 231 in FIG. 3a, communicates with the other half portion 24 of the fluid quick connector 24/224. As illustrated in FIG. 3a, the mating half or portion 24 of fluid quick connector 24/224 sits at the distal end 26d of a cylindrical boss or projection 26 of frame 12 of LRU 10. The mating half 24 of quick fluid connector 24/224 is mounted axially or on the axis of the cylindrical projecting boss 26. Boss 26 projects from a supporting surface 26s which is approximately orthogonal to the axis 8' of fluid quick connector portion 24. The structures of FIGS. 3a and 3b are such that, when the structures are mated, the axes 8, 8' of the two mating portions 24 and 224 of the fluid quick connector coincide, and the axes of cylindrical projecting boss 26 and of cylindrical well 226 coincide.

FIGS. 3a and 3b are different simplified perspective or isometric views of mating halves of fluid quick connects and their associated structures. In FIGS. 3a and 3b, the lower portion of an LRU 10 is illustrated, showing its fluid quick connect 24ι according to an aspect of the invention, in spaced relation to the rack body portion 212. The fluid flow path extending through the rack body 212 for providing coolant fluid to, or for removing coolant fluid from, the LRU associated with the quick connect half 224 is illustrated as a coolant manifold supply or return channel 230. Coolant manifold channel 230 communicates with one mating half 224 of a fluid quick connector, illustrated in FIG. 3b as being mounted at the fundus or bottom of a "well," "chamber," or cylindrical opening 226 defined in the structure of the body 212 (of the rack 210 of FIG. 2). The mating half 224 of the fluid quick connector is mounted on the axis of well 226. A corresponding coolant manifold channel, illustrated in phantom as 231 in FIG. 3a, communicates with the other half portion 24 of the fluid quick connector 24/224. As illustrated in FIG. 3a, the mating half or portion 24 of fluid quick connector 24/224 sits at the distal end 26d of a cylindrical boss or projection 26 of frame 12 of LRU 10. The mating half 24 of quick fluid connector 24/224 is mounted axially or on the axis of the cylindrical projecting boss 26. Boss 26 projects from a supporting surface 26s which is approximately orthogonal to the axis 8 of fluid quick connector portion 24. The structures of FIGS. 3a and 3b are such that, when the structures are mated, the axes 8, 8' of the two mating portions 24 and 224 of the fluid quick connector coincide, and the axes of cylindrical projecting boss 26 and of cylindrical well 226 coincide.

When the cold plate or frame 12 of line replaceable unit (LRU) 10 of FIGS. 3a and 3b is moved in the direction of arrow 328 relative to the body portion 212 of rack 210 (of FIG. 2), the projecting boss 26 extends into well 226 as the mating halves 24 and 224 of the fluid quick connector 24/224 are brought together. For this purpose, the outer diameter of cylindrical boss 26 is at least nominally smaller than the inner diameter of well 226. It will be appreciated that as soon as the distal end 26d of boss 26 begins to enter well 226, a closed chamber is defined by the fundus and cylindrical walls of well 226 in conjunction with the distal end or wall of projecting boss 26. When this closed chamber is formed by juxtaposition of the boss 26 and well 226, the mating halves 24, 224 of the fluid quick connector lie within the closed chamber.

Fluid quick connectors are subject to leakage during connection, disconnection, and possibly due to failure. It is generally undesirable to allow the leaked fluid to flow through the closely packed LRUs, as the fluid may enter an LRU or connections thereto. The presence of a coolant fluid may have undesirable radio-frequency or resistance effects which can adversely and directly affect the performance of the unit. Even after the fluid dries, it may leave a residue which adversely affects the electrical performance. Such leaked coolant may even cause corrosion of critical parts of the LRUs and result in failure.

According to an aspect of the invention, the closed chamber defined by the engagement of the projecting boss 26 and well 226 is sealed against leakage. In the embodiment of FIG. 3a, this is accomplished by the use of two resilient O-rings. A first O-ring 326 is placed around the cylindrical portion of projecting boss 26 near its distal end 26d. This O-ring 326 is radially loaded when the boss engages the well, and provides a seal between the walls of the well and the boss. An additional O-ring 328 is placed around the base of projecting boss 26, and lies against the supporting structure of the boss. In effect, O-ring 328 lies against orthogonal surface 26s, and, when the two portions 26, 226 are fully engaged, is axially loaded between surface 26s and a corresponding surface 226os annularly disposed around the opening of well 226 and orthogonal to well axis 8'. An angle may be added to surface 226os in the region around aperture 226, as suggested by surface 226ds.

Figure 4:
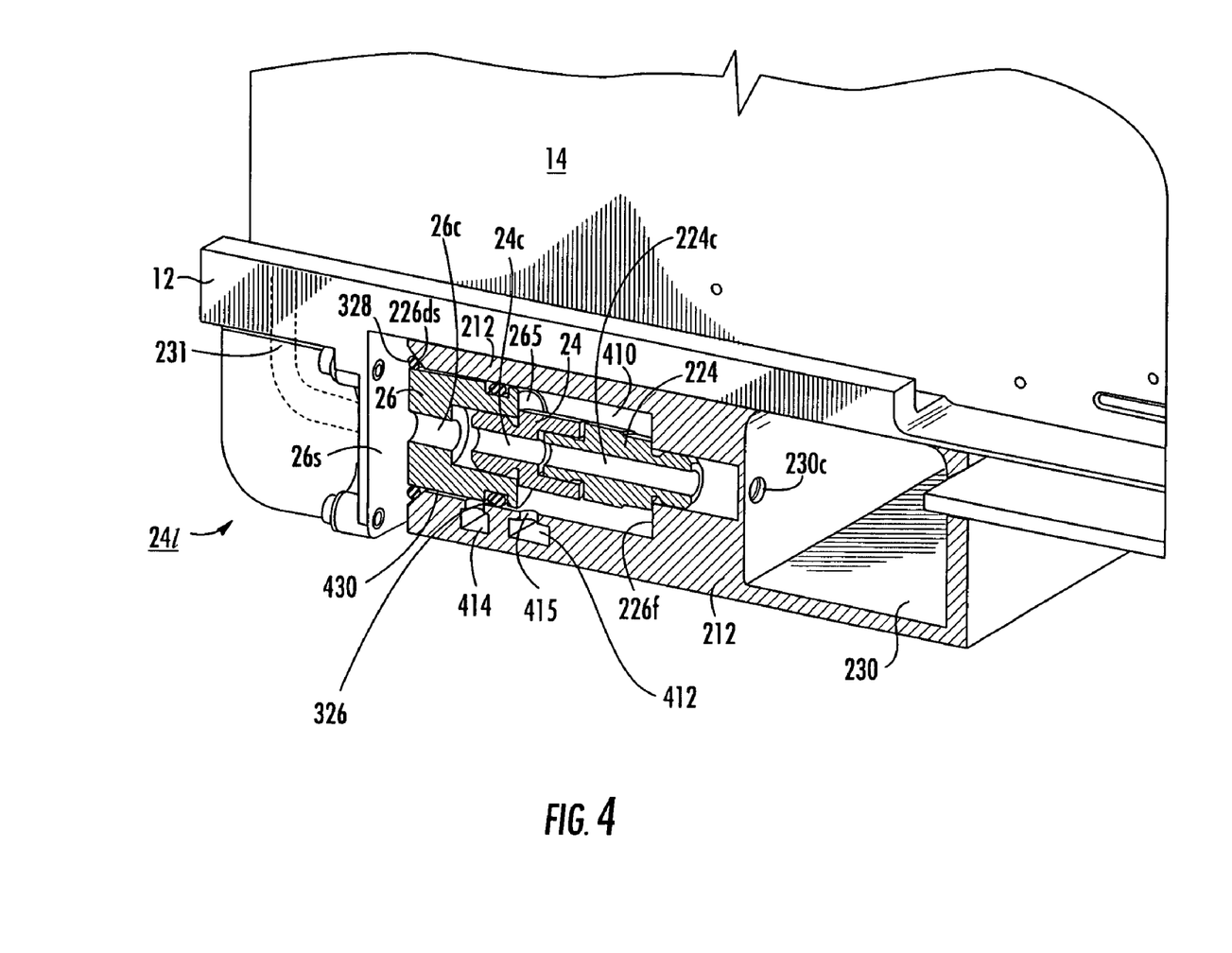
FIG. 4 is a simplified cross-sectional view of the fluid quick connect arrangement of FIGS. 3a and 3b in a mated condition, illustrating the paths for the flow of fluid resulting from minor dripping during engagement of the fluid quick connects.

FIG. 4 illustrates the structure of FIGS. 3a and 3b with the LRU 10 moved toward the rack 210 so as to fully engage the two mating halves of fluid quick connector 24/224 and the two mating halves 26/226. The fluid channels through the mated fluid quick connector are illustrated as 24c and 224c. As illustrated in FIG. 4, the two mating halves 26, 226 together define a closed chamber or circular manifold cavity 410 containing the mated halves 24, 224 of the fluid quick connector 24/224. Closed chamber 410 communicates by way of a fluid path or hole 415 with a primary drainage channel 412. So long as the fluid quick connector 24/224 does not leak, no coolant fluid will enter chamber 410, and all the coolant fluid will remain constrained within the fluid paths including 231, 26c, 24c, 224c, 230c, and 230 of FIG. 4. If the fluid quick connector 24/224 of FIG. 4 should be subject to minor dripping during engagement or disengagement, coolant fluid may enter the fluid chamber 410. So long as O-ring 326 prevents traversal of leaked fluid into an interstice region designated 430, lying between the cylindrical outer surface 26os of boss 26 and the cylindrical inner surface 226is of well 226, all the coolant fluid entering chamber 410 must exit by way of primary drainage channel 412.

Figure 5:
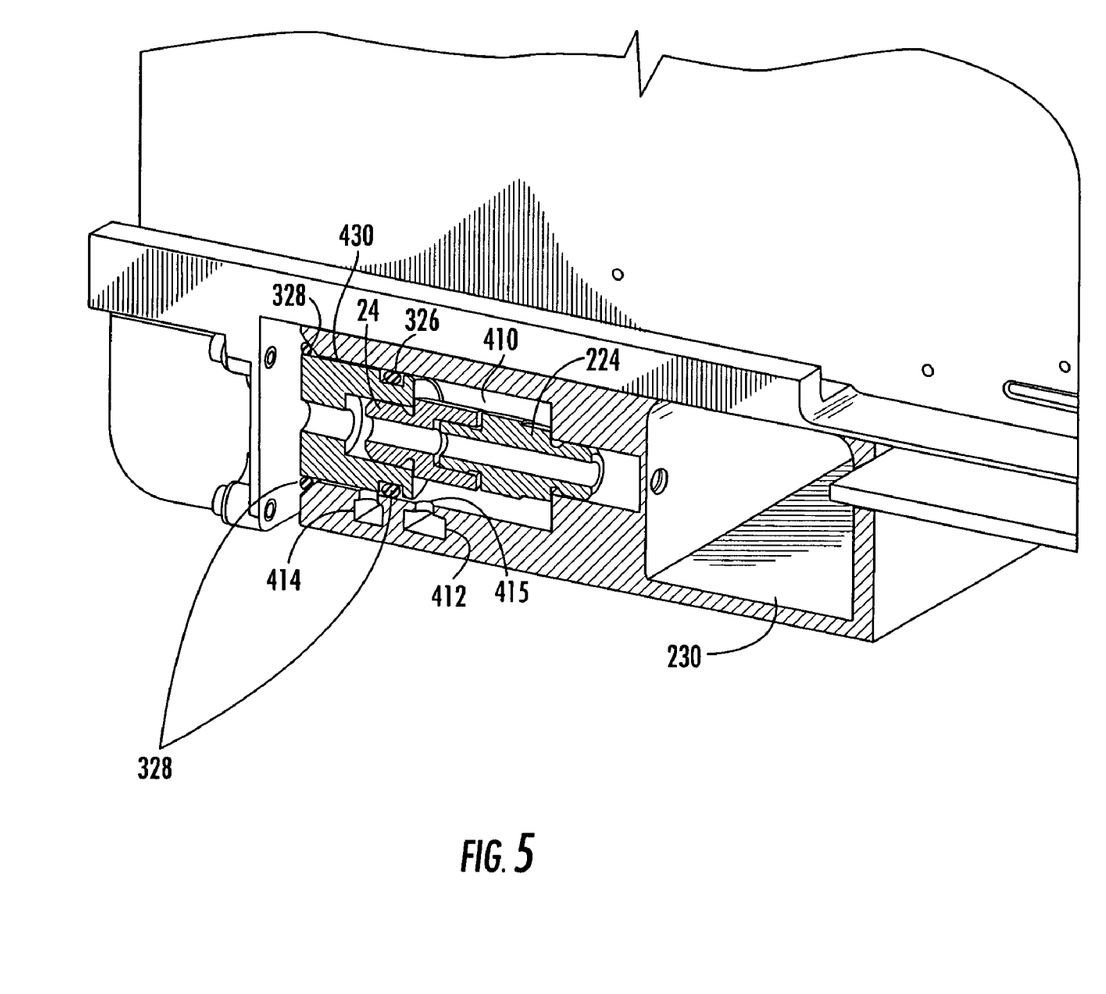
FIG. 5 is a simplified cross-sectional view of the fluid quick connect arrangement corresponding to FIG. 4a, illustrating the paths for the flow of fluid resulting from failure of the fluid quick connects.

FIG. 5 is similar to FIG. 4, and corresponding elements are designated by like reference alphanumerics. In FIG. 5, the assumption is made that the coolant is pressurized and that the fluid quick connector 24/224 has failed catastrophically. In this event, the fluid chamber 410 will tend to fill with pressurized coolant. Some of the leaked fluid will leave chamber 410 by way of aperture 415 and primary drainage channel 412. However, the pressure may nevertheless be high enough so that radially loaded O-ring 326 may not be able to prevent leakage of some coolant from chamber 410 into interstitial region 430. Interstitial region 430 communicates with a further auxiliary fluid path or channel 414. Any fluid making its way past radially loaded O-ring 326 can make its way to fluid channel 414 and escape from the system. Axially loaded O-ring 328 prevents leakage of coolant fluid which enters interstice 430 from leaking away from the primary and auxiliary fluid flow channels 230, 412, and 414 to a location where it could damage or impair operation of the equipment.

Figure 6:
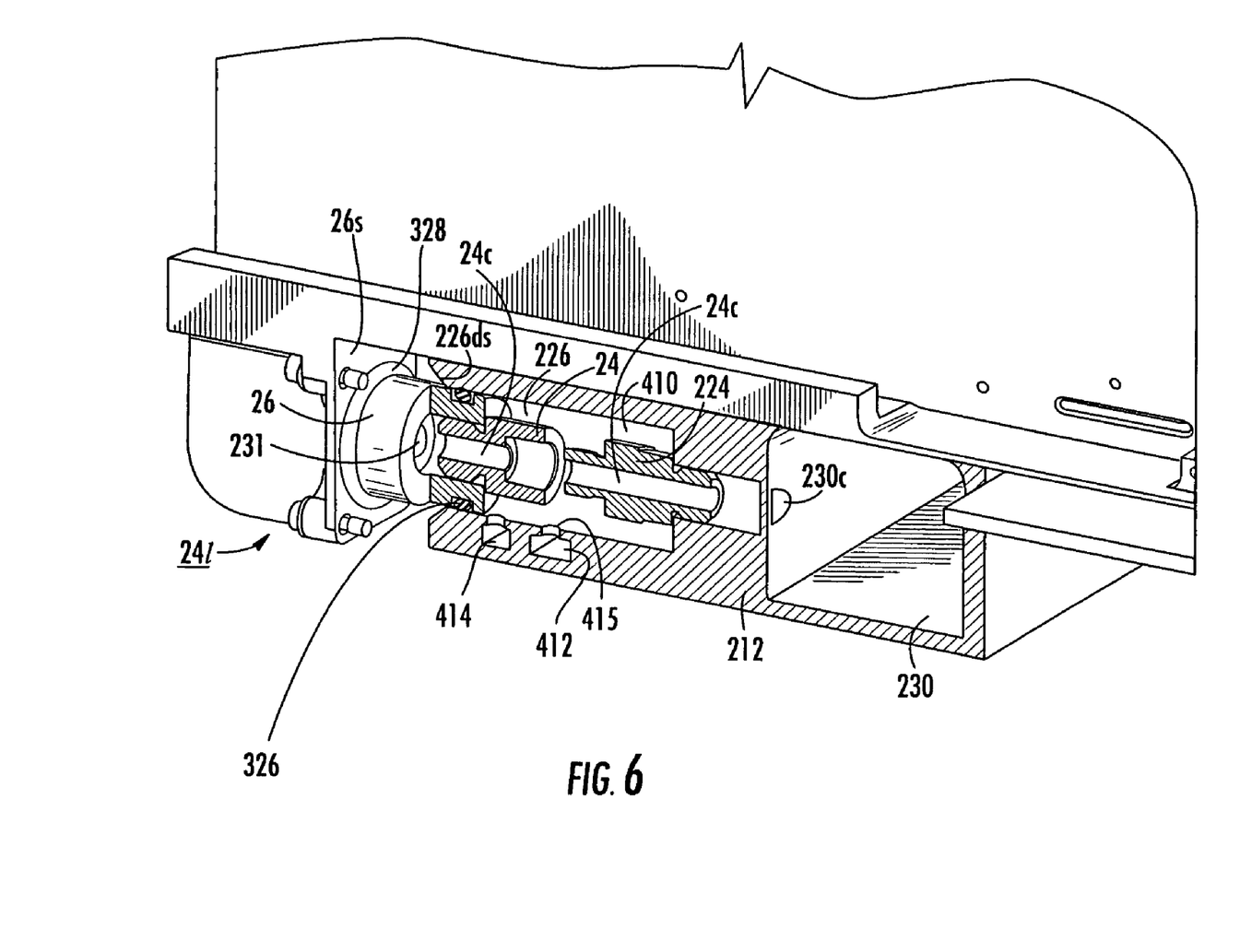
FIG. 6 is a simplified cross-sectional view of the fluid quick connect arrangement corresponding to FIG. 4a in a partially mated condition, illustrating the paths for the flow of fluid resulting from dripping during engagement or disengagement.

FIG. 6 illustrates the structure of FIG. 4 in a partially engaged or partially disengaged condition. In FIG. 6, elements corresponding to those of FIGS. 3a, 3b, 4 and 5 are designated by like reference alphanumerics. In FIG. 6, liquid quick connect portions 24 and 224 are disengaged, but the distal end 26ds of boss 26, and O-ring 326, continue located within the confines of well 226. With O-ring 326 of FIG. 6 located within the well 226, the inner surface 226is (FIG. 3b) of well 226 bears radially on O-ring 326, thereby providing the necessary forces to tend to prevent leakage from the cavity 410. It will be understood that some leakage may occur from the fluid quick connect 24/224 when connecting and especially when disconnecting. Any fluid which escapes from the fluid quick connect has a path for escape by way of both coolant drainage channels 410 and 412. The drainage channels 410 and 412 may be routed to any desired location at which the coolant may be safely ejected or recovered.

An arrangement according to an aspect of the invention is for making fluid connection between a fluid source (231) and a fluid sink (230). The arrangement comprises a first portion (24) of a mating quick fluid connector (24/224) coupled to the fluid source (231), and a second portion (224) of the mating quick fluid connector (24/224) coupled to the fluid sink (230), whereby leakage between the first (24) and second (224) portions of the quick fluid connector (24/224) may occur. This leakage may result from failure of the mated quick connector (24/224) or from inherent limitations of the quick connector during mating and demating (engagement and disengagement). First (26) and second (226) portions of a mating fluid chamber (410) are provided, each of the first (26) and second (226) portions of the mating fluid chamber (410) being associated with one of the first (24) and second (224) portions of the quick fluid connector (24/224). The first (26) and second (226) portions of the mating fluid chamber (410) define the chamber (410) when the first (24) and second (26) portions of the quick fluid connector (24/224) are mated. The chamber (410), when the first (24) and second (224) portions of the quick fluid connector (24/224) are mated, surrounds those portions of the quick fluid connector (24/224) which are subject to leakage. A fluid drainage channel (412) which is separate from the source and sink is coupled to the fluid chamber (410) for providing a path for drainage of the leakage entering the chamber (410).

In a particular embodiment of the arrangement, the first portion (24) of the quick fluid connector (24/224) is coaxially mounted at the end (26ds) of a projecting, circularly cylindrical boss (26) defining an exterior first diameter (d). The second portion (224) of the quick fluid connector (24/224) is coaxially mounted at the fundus or bottom (226f) of a cylindrical aperture or well 226 having an interior second diameter (D) greater than the first diameter (d). In one version of this embodiment, the arrangement further comprises at least a first O-ring (326) extending, at a first location, about an exterior surface (26os) of the projecting circularly cylindrical boss (26), and a second O-ring (328) extending, at a second location different from the first location, about the exterior surface (26os) of the projecting cylindrical boss (26).

In a most preferred embodiment, the circularly cylindrical boss (26) projects from a surface (26s) of a first structure (241) which is orthogonal to the axis (8) of the boss (26), and the aperture or well (226) is defined below a surface (226os) of a second structure (212), which surface is orthogonal to the axis (8') of the aperture (226).

In one manifestation of this version, a first O-ring (326) is located along the length of the projecting boss (26), and a second O-ring (328) is located at the juncture of the cylindrical boss (26) and the surface (26*s*) from which it projects.

In any embodiment, the first structure may be part of a line replaceable electronics module and the second structure may be a cold plate manifold.

What is claimed is:

1. An arrangement for making fluid connection between a fluid source and a fluid sink, said arrangement comprising:
    a first portion of a mating quick fluid connector coupled to said fluid source;
    a second portion of said mating quick fluid connector coupled to said fluid sink, whereby leakage between said first and second portions of said quick fluid connector may occur;
    first and second mating portions of a fluid chamber, each of said first and second mating portions of said fluid chamber being associated with one of said first and second portions of said quick fluid connector, respectively, said first and second mating portions of said fluid chamber mating to define said fluid chamber when said first and second portions of said quick fluid connector are mated, which fluid chamber, when said first and second portions of said quick fluid connector are mated, surrounds those portions of said quick fluid connector which are subject to leakage; and
    a fluid channel coupled to said fluid chamber for providing a path for drainage of said leakage, wherein:
    said first portion of said quick fluid connector is coaxially mounted at the end of a projecting, circularly cylindrical boss defining an exterior first diameter;
    said second portion of said quick fluid connector is coaxially mounted at the fundus of a cylindrical aperture having an interior second diameter greater than said first diameter.

2. An arrangement according to claim 1, further comprising at least a first O-ring extending, at a first location, about an exterior surface of said projecting circularly cylindrical boss.

3. An arrangement according to claim 2, further comprising a second O-ring extending, at a second location different from said first location, about said exterior surface of said projecting cylindrical boss.

4. An arrangement for making fluid connection between a fluid source and a fluid sink, said arrangement comprising:
    a first portion of a mating quick fluid connector coupled to said fluid source;
    a second portion of said mating quick fluid connector coupled to said fluid sink, whereby leakage between said first and second portions of said quick fluid connector may occur;
    first and second mating portions of a fluid chamber, each of said first and second mating portions of said fluid chamber being associated with one of said first and second portions of said quick fluid connector, respectively, said first and second mating portions of said fluid chamber mating to define said fluid chamber when said first and second portions of said quick fluid connector are mated, which fluid chamber, when said first and second portions of said quick fluid connector are mated, surrounds those portions of said quick fluid connector which are subject to leakage; and
    a fluid channel coupled to said fluid chamber for providing a path for drainage of said leakage, wherein:
    said first portion of said quick fluid connector is coaxially mounted to, and projects from a free end of, a circularly cylindrical boss, defining a first exterior diameter, projecting from a surface of a first structure, which surface of said first structure is orthogonal to said axis of said boss;
    said second portion of said quick fluid connector is coaxially mounted to, and projects from, the fundus of a circularly cylindrical bore, defining a first interior diameter greater than said first diameter, said bore being defined below a surface of a second structure, which surface of said second structure is orthogonal to said axis of said bore.

5. An arrangement according to claim 4, further comprising at least a first O-ring extending, at a first location, about an exterior surface of said projecting circularly cylindrical boss.

6. An arrangement according to claim 5, further comprising a second O-ring extending, adjacent the juncture of said projecting cylindrical boss and said surface of said first structure, about said exterior surface of said projecting cylindrical boss.

7. An arrangement according to claim 6, wherein said first structure is a line replaceable electronics module and said second structure is a cold plate.

8. An arrangement for making fluid connection between a fluid source and a fluid sink, said arrangement comprising:
    a first portion of a mating quick fluid connector coupled to said fluid source, said first portion of said quick fluid connector being coaxially mounted at the distal end of a projecting cylindrical boss having an outer surface defining a first outer diameter;
    a second portion of said mating quick fluid connector coupled to said fluid sink, said second portion of said quick fluid connector being coaxially mounted at the fundus of a well depressed below a surface, said well defining a second interior diameter greater than said first diameter, so that when said first and second portions of said quick fluid connector are juxtaposed but not mated, at least said distal end of said boss is located within said well to thereby define a closed cavity surrounding those portions of said quick fluid connector which are subject to leakage; and
    a fluid drainage channel coupled to said fluid chamber for providing a path for drainage of said leakage.

9. An arrangement according to claim 8, further comprising a first O-ring surrounding said outer surface of said boss at a first location adjacent said distal end of said boss, said first location adjacent said distal end being such that, when said first and second portions of said quick fluid connector are juxtaposed but not mated, said first O-ring seals said chamber against leakage.

10. An arrangement according to claim 9, further comprising:
    a second O-ring surrounding said outer surface of said boss at a second location more proximal than said first location of said first O-ring, to thereby seal an interstice lying between said first and second O-rings; and
    a second drainage channel communicating with said interstice.

* * * * *